United States Patent
Okamura et al.

(10) Patent No.: US 9,437,222 B1
(45) Date of Patent: Sep. 6, 2016

(54) SPIN TORQUE OSCILLATOR WITH HIGH SPIN TORQUE EFFICIENCY AND RELIABILITY

(71) Applicant: HGST Netherlands B.V., Amsterdam (NL)

(72) Inventors: Susumu Okamura, Kanagawa (JP);
Masao Shiimoto, Kanagawa (JP);
Katsuro Watanabe, Ibaraki (JP);
Masashige Sato, Kanagawa (JP);
Keiichi Nagasaka, Kanagawa (JP); Yo Sato, Kanagawa (JP); Masukazu Igarashi, Saitama (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/726,513

(22) Filed: May 30, 2015

(51) Int. Cl.
  *G11B 5/31* (2006.01)
  *G11B 5/235* (2006.01)
  *H03B 15/00* (2006.01)
  *G11B 5/127* (2006.01)
  *G11B 5/00* (2006.01)

(52) U.S. Cl.
  CPC .......... *G11B 5/3146* (2013.01); *G11B 5/1278* (2013.01); *G11B 5/235* (2013.01); *G11B 5/314* (2013.01); *H03B 15/006* (2013.01); *G11B 2005/0024* (2013.01)

(58) Field of Classification Search
  None
  See application file for complete search history.

(56) References Cited

U.S. PATENT DOCUMENTS

| | | | |
|---|---|---|---|
| 8,064,244 B2 | 11/2011 | Zhang et al. | |
| 8,208,219 B2 | 6/2012 | Zhang et al. | |
| 8,300,356 B2 | 10/2012 | Zhang et al. | |
| 8,351,165 B2 * | 1/2013 | Carey et al. | G11B 5/3906 360/324.11 |
| 8,488,373 B2 | 7/2013 | Zhang et al. | |
| 9,099,107 B1 * | 8/2015 | Igarashi et al. | G11B 5/3146 |
| 9,099,120 B1 * | 8/2015 | Freitag et al. | G11B 5/3909 |
| 2013/0224521 A1 | 8/2013 | Wang et al. | |
| 2014/0063648 A1 * | 3/2014 | Shiroishi et al. | G11B 5/3146 360/75 |
| 2014/0133048 A1 | 5/2014 | Shiimoto et al. | |
| 2014/0177092 A1 | 6/2014 | Katada et al. | |
| 2014/0355152 A1 * | 12/2014 | Park et al. | G11B 5/1278 360/75 |

OTHER PUBLICATIONS

Tomoya, N. "Spin-dependent scattering in CPP-GMR using Heusler alloy and the selection of the spacer material," Doctoral Thesis submitted at the University of Tsukuba, Mar. 25, 2011, pp. 1-159.

\* cited by examiner

*Primary Examiner* — Craig A. Renner
(74) *Attorney, Agent, or Firm* — Zilka-Kotab, PC

(57) ABSTRACT

A magnetic oscillator for use in Microwave Assisted Magnetic Recording (MAMR). The magnetic oscillator can be a spin torque oscillator and includes a magnetic spin polarization layer, a magnetic field generation layer and a non-magnetic intermediate layer sandwiched between the magnetic spin polarization layer and the magnetic field generation layer. The non-magnetic intermediate layer is constructed of a material that provides improved performance, increased lifespan and thermal robustness. The magnetic intermediate layer is constructed of an alloy of Ag and an element X. More preferably the element X can be Sn or Zn.

13 Claims, 11 Drawing Sheets

SPIN TORQUE OSCILLATOR WITH HIGH SPIN TORQUE EFFICIENCY AND RELIABILITY

FIELD OF THE INVENTION

The present invention relates to magnetic data recording and more particularly to Microwave Assisted Magnetic Recording (MAMR) using a robust, high efficiency magnetic oscillator.

BACKGROUND

At the heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected data tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk, creating an air bearing. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When current flows through the coil, a resulting magnetic field causes a magnetic flux to flow through the coil, which results in a magnetic write field emitting from the tip of the write pole. This magnetic field is sufficiently strong that it locally magnetizes a portion of the adjacent magnetic media, thereby recording a bit of data. The write field then, travels through a magnetically soft under-layer of the magnetic medium to return to the return pole of the write head.

A magnetoresistive sensor such as a Giant Magnetoresistive (GMR) sensor or a Tunnel Junction Magnetoresistive (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the magnetic media.

With ever increasing data density requirements it becomes necessary to write ever smaller bits of data onto a magnetic media. This presents challenges in terms of ensuring that the recorded bits are thermally, magnetically stable. Thermal stability of the bits can be achieved by constructing the magnetic media with a higher magnetic coercivity and magnetic anisotropy, however, this also requires a higher write field to record the data, which is difficult to achieve with the necessary smaller write pole. One way to overcome this challenge is through the use of Microwave Assisted Magnetic Recording (MAMR), wherein an oscillating magnetic field is generated near the write pole. This oscillating magnetic field magnetically excites the magnetic media, making it easier to write to. However, in order to be effective, the magnetic oscillator used to generate the oscillating magnetic field must be both thermally robust, having a long life and also efficient so as to generate a sufficiently strong magnetic field.

SUMMARY

The present invention provides a magnetic oscillator that includes, a magnetic spin polarization layer, a magnetic field generation layer, and a nonmagnetic intermediate layer sandwiched between the magnetic spin polarization layer and the magnetic field generation layer. The nonmagnetic intermediate layer is constructed of an alloy of Ag and an element X.

The element X can be Zn or Sn. If constructed of Ag—Zn, the intermediate layer preferably has 5-50 atomic percent Zn. If constructed of Ag—Sn, the intermediate layer preferably has 3-13 atomic percent Sn.

The presence of an alloying element such as Zn or Sn in the Ag alloy provides significant advantages with regard to performance and reliability. These alloying elements prevent diffusion of elements between the intermediate layer and the adjacent magnetic layers which greatly increases thermal robustness and reliability of the magnetic oscillator. In addition, the alloying elements greatly reduce the roughness of the intermediate layer, which reduces interlayer magnetic coupling and increases the efficiency of the magnetic oscillator.

These and other features and advantages of the invention will be apparent upon reading of the following detailed description of the embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
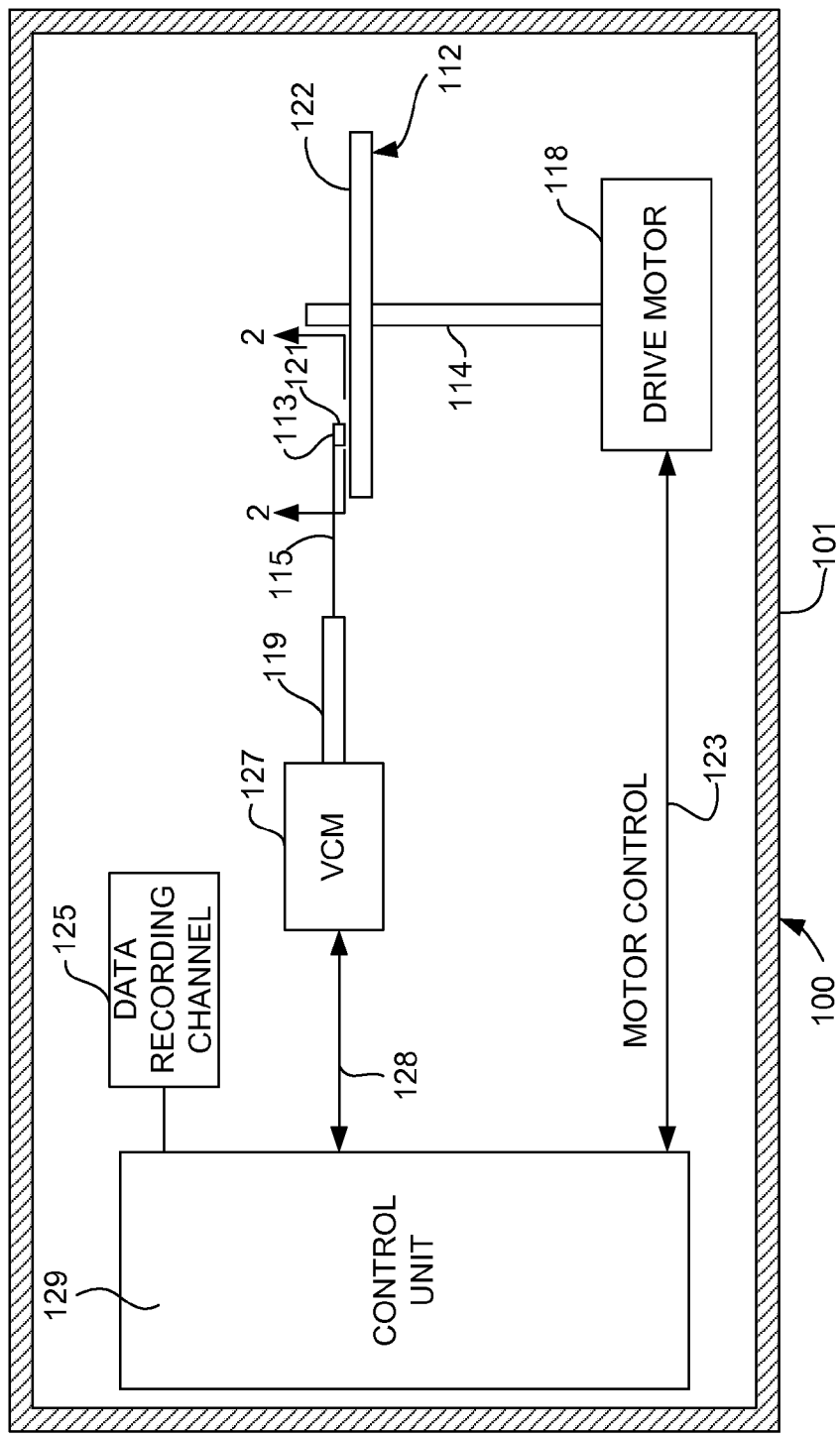
FIG. 1 is a schematic illustration of a disk drive system in which the invention might be embodied.

Referring now to FIG. 1, there is shown a disk drive 100. The disk drive 100 includes a housing 101. At least one rotatable magnetic disk 112 is supported on a spindle 114 and rotated by a disk drive motor 118. The magnetic recording on each disk may be in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, the slider 113 moves in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases the slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by the controller 129.

During operation of the disk storage system, the rotation of the magnetic disk 112 generates an air bearing between the slider 113 and the disk surface 122, which exerts an upward force or lift on the slider. The air bearing thus counter-balances the slight spring force of the suspension 115 and supports the slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on the media 112. Write and read signals are communicated to and from write and read heads 121 by way of recording channel 125.

Figure 2:
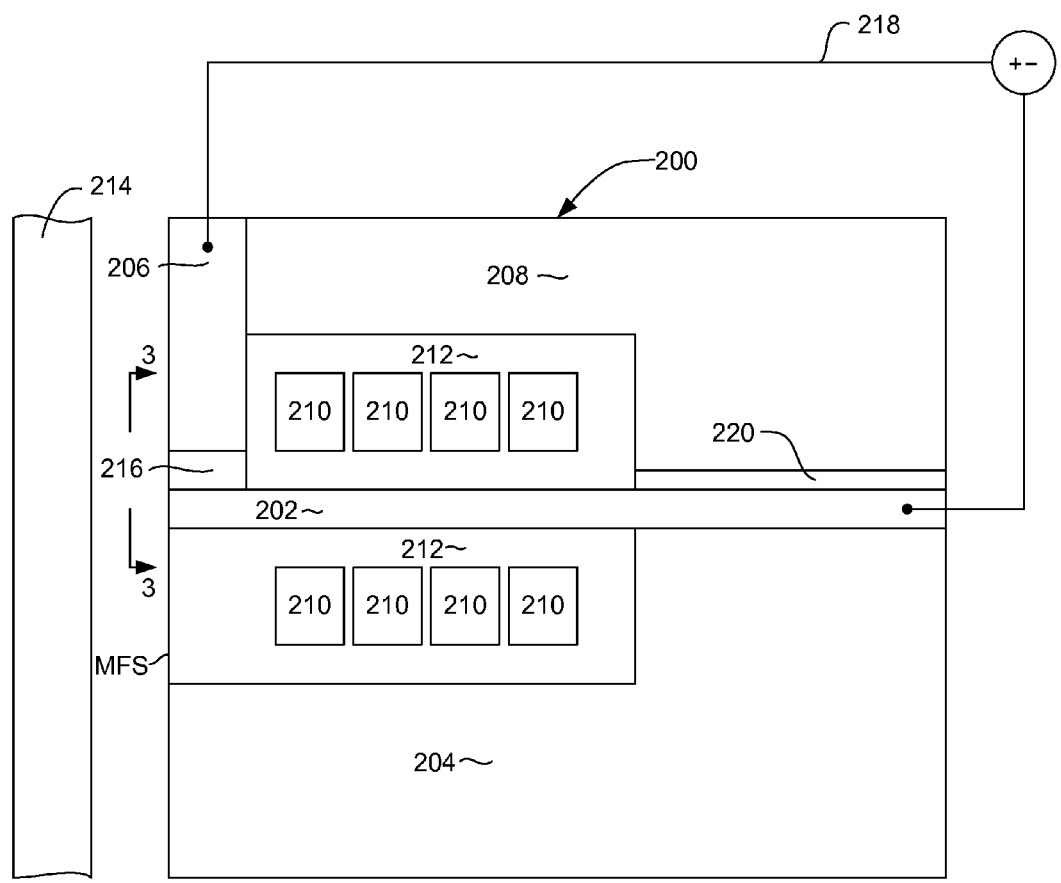
FIG. 2 is a side, cross sectional view of a magnetic write element according to an embodiment.

FIG. 2 is a side, side cross sectional view of a magnetic write element 200 that can be formed on a slider 113 such as described above with reference to FIG. 1. The write element 200 includes a magnetic write pole 202 and a magnetic return pole 204, both of which extend to a media facing surface (MFS). The magnetic return pole 204 is magnetically connected with the write pole 202 at a region located away from the media facing surface (MFS). Various other intermediate magnetic structures can be used to magnetically connect the write pole 202 with the return pole 204, such as a magnetic shaping layer and/or a magnetic back gap layer, both of which are not shown in FIG. 2 for purposes of clarity.

The write element 200 can also include a trailing magnetic shield 206. The trailing magnetic shield is located at the media facing surface (MFS) and can be magnetically connected with the write pole 202 and return pole 204 in a region removed from the media facing surface MFS by a trailing return pole 208.

A non-magnetic, electrically conductive write coil 210, shown in cross section in FIG. 2 passes above and below the write pole 202. The write coil 210 can be constructed of a material such as Cu and can be embedded in a non-conductive, electrically insulating material 212 such as alumina. When a current flows through the write coil 210, a magnetic field is generated, resulting in a magnetic flux flowing through the write pole 202 and return pole 204. This causes a magnetic field to emit from the tip of the write pole 202 toward an adjacent magnetic media 214, thereby writing a magnetic bit to the magnetic media 214. This magnetic write field, then, travels through the magnetic media and returns to the return pole 204. Because the return pole 204 has a much larger area at the media facing surface than the write pole 202 does, the return of the magnetic field to the return pole 204 does not erase the previously recorded bit of data.

The trailing shield 206 is located in a trailing direction relative to the write pole 202, and is separated from the trailing edge of the write pole 202 by a desired spacing (trailing gap). The presence of the trailing shield facilitates the recording of data to the magnetic media 214 by increasing the field gradient.

In order to increase data density, the size of the recorded magnetic bits must be reduced. However, as the magnetic bits become smaller they also become less magnetically stable. The thermal stability of these magnetic bits can be improved by increasing the magnetic coercivity and/or magnetic anisotropy of the magnetic media. This however, makes the bits harder to record, requiring an increased write field to record the bits. Unfortunately, as the write pole 202 becomes smaller (in order to produce a smaller data bit) it becomes even harder to generate a sufficiently strong write field to record to such a high coercivity media.

One way to overcome this problem through the use of Microwave Assisted Magnetic Recording (MAMR). In order to implement such microwave assisted magnetic recording, a magnetic microwave oscillator such as a spin torque oscillator 216 is provided, preferably in the space between the write pole 202 and the trailing magnetic shield 206. As the name indicates, the magnetic microwave oscillator 216 has a structure (described herein below) that generates an oscillating magnetic field. This oscillating magnetic field locally, magnetically excites the magnetic media 214 in such a manner that the media is significantly easier to write to. Electrical circuitry 218 can be connected with the trailing shield 206 and write pole 202 so as to provide an electrical current to the magnetic oscillator 216. An insulation layer 220 may also be provided to ensure that the current supplied by the circuitry 218 flows through the magnetic oscillator 216. The function of the magnetic oscillator 216 will be described in greater detail herein below.

Figure 3:
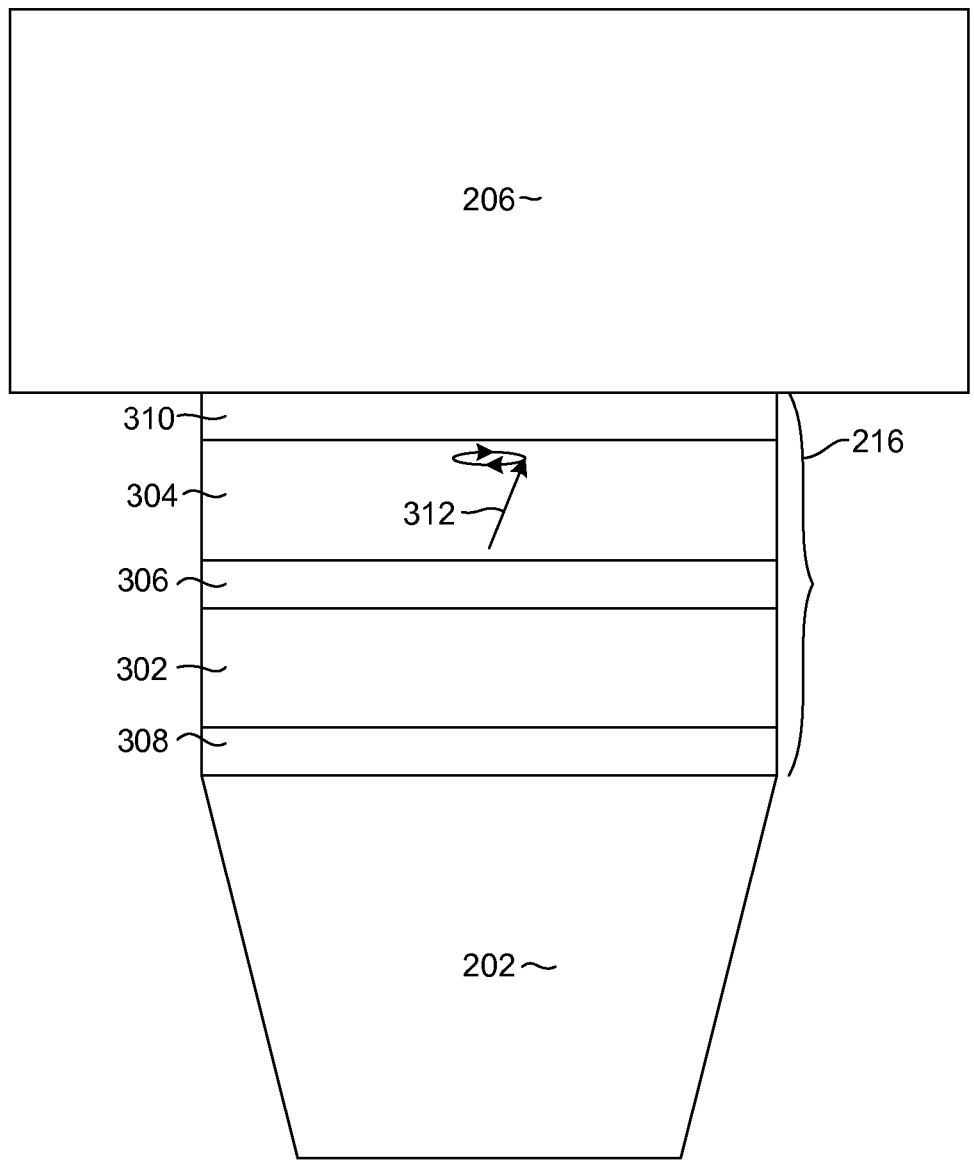
FIG. 3 is an enlarged view of a magnetic oscillator according to an embodiment as seen from the media facing surface.

FIG. 3 is an enlarged view showing a schematic illustration of a magnetic oscillator 216 as seen from line 3-3 of FIG. 2. As can be seen, the magnetic oscillator 216 is sandwiched between the write pole 202 and the trailing magnetic shield 206. The magnetic oscillator 216 includes first and second magnetic layers 302, 304 and a non-magnetic, electrically conductive intermediate layer 306 sandwiched between the first and second magnetic layers 302, 304. An under-layer 308 can be provided at the bottom of the magnetic oscillator 216 to initiate a desired grain structure in the above formed layers, and a capping layer 310 can be provided at the top of the magnetic oscillator 216.

One of the magnetic layers (e.g. 302) is a spin polarization layer (SPL) and the other magnetic layer (e.g. 304) is a magnetic field generation layer (FGL). When an electrical current flows through the magnetic oscillator 216, electrons travel through the spin polarization where their electron spins become aligned as a result of the magnetization of the spin polarization layer 302. These spin oriented electrons then flow through the non-magnetic intermediate layer 306 and into the field generation layer 304. The spin oriented electrons exert a spin torque on the magnetization of the field generation layer 304. This spin torque results in an oscillating magnetic field that moves in a precessional manner as indicated by arrow 312. The magnetic layers 302, 304 can be of various compositions, such as CoFe or NiFe. The capping layer can be a material such as Ta or Ru or a combination of these.

The non-magnetic intermediate layer 306 plays an important role in the performance and reliability of the magnetic oscillator 216. In order to provide high magnetic oscillation field, it is preferable that the intermediate layer 306 have a low electrical resistance. It is also desirable that the intermediate layer have a texture that provides improved performance of the field generation layer 304 deposited there-over. On the other hand, it is also desirable for the intermediate layer to exhibit good reliability and robustness, even at elevated temperatures. Furthermore, these desired properties of the intermediate layer are often at cross purposes with one another. Materials having good properties for meeting one requirement tend to poorly meet other requirements. For example, Cu provides a low resistance, but provides poor thermal stability. When Cu is used as an intermediate layer 306, elevated temperatures can cause diffusion of elements between the intermediate layer 306 and the surrounding magnetic layers 302, 304. This leads to thermal breakdown and unreliability. On the other hand a material such as Ag can provide good electrical conductivity, and sufficiently high thermal robustness, but exhibits poor roughness, leading to decreased performance of the oscillator.

The inventors have discovered a family of materials that, when used in the intermediate layer 306 provide optimal properties for all of the competing parameters. Use of these materials provide: high electrical conductivity; excellent thermal reliability; and low roughness. To this end, the intermediate layer 306 can be constructed of an alloy of Ag and an element X. The element X can be Zn or Sn. If constructed of an Ag—Zn alloy, the intermediate layer 306 preferably has 5-50 atomic percent Zn. If the intermediate layer 306 is constructed of an Ag—Sn alloy, then it preferably contains 3-13 atomic percent Sn.

Figure 4:
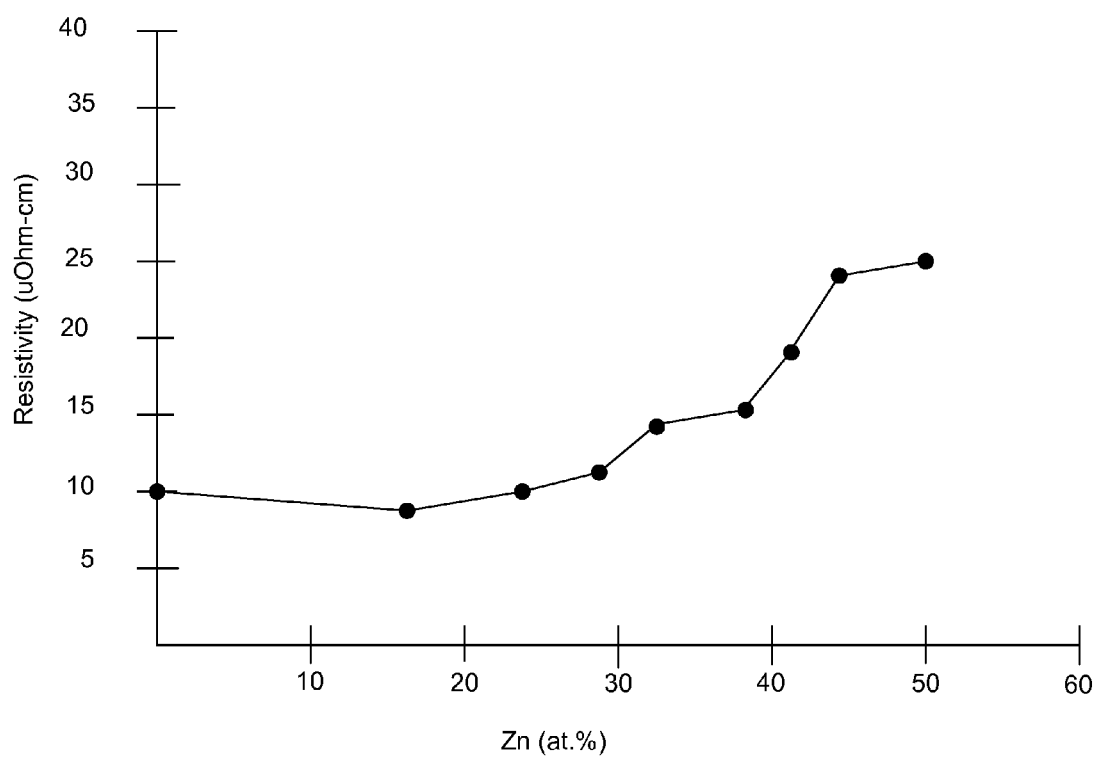
FIG. 4 is a graph showing resistivity as a function of Zn content for a magnetic oscillator using a Ag—Zn alloy in its intermediate layer.

FIGS. 4 through 7 show various performance and reliability advantages of a magnetic oscillator having an intermediate layer formed of an Ag—Zn alloy. FIG. 4 shows how the resistivity of the intermediate layer 306 varies with Zn content for a magnetic oscillator having an Ag—Zn intermediate layer 306. As will be recalled, magnetic oscillator performance improves with reduced resistivity. It is desired that the resistivity of the intermediate layer 306 be no greater than 30 uOhm-cm. As can be seen in FIG. 4, the resistivity of the intermediate layer is sufficiently low for Zn contents ranging from 5-50 atomic percent.

Figure 5:
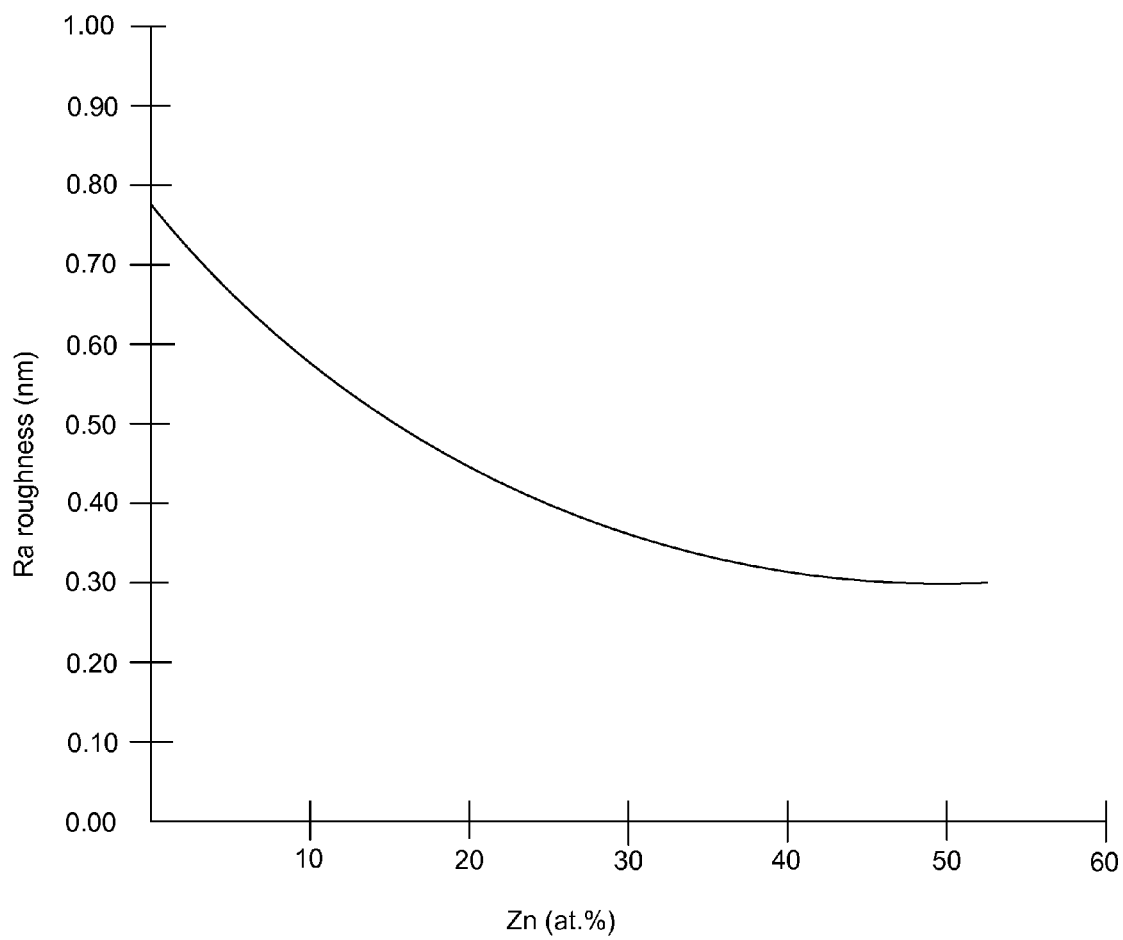
FIG. 5 is a graph showing roughness as a function of Zn content for a magnetic oscillator using a Ag—Zn alloy in its intermediate layer.

FIG. 5 shows the roughness of the intermediate layer for various Zn contents. As can be seen, the roughness decreases with increasing Zn content, achieving desirable roughness targets with Zn contents ranging from 5-50 atomic percent.

Figure 6:
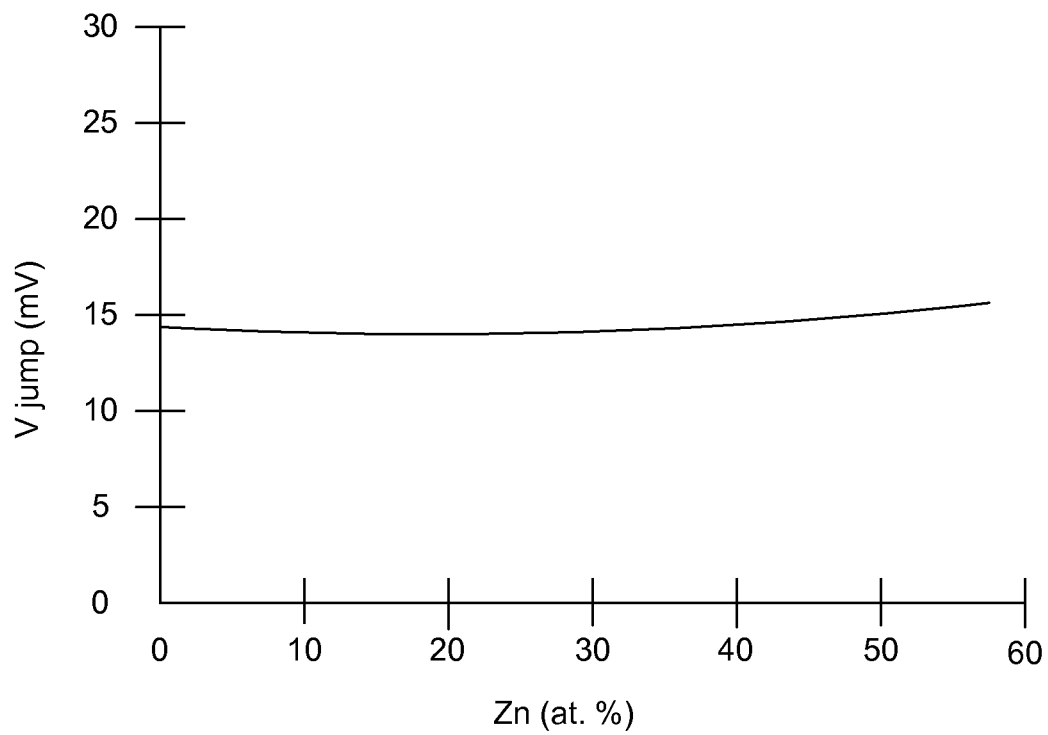
FIG. 6 is a graph showing voltage jump (V jump) as a function of Zn content for a magnetic oscillator using a Ag—Zn alloy in its intermediate layer.

FIG. 6 shows voltage jump (V jump) as a function of Zn content. As can be seen, the voltage jump for the oscillator 216 remains at desirable levels, around 14 mV, for a wide range of Zn concentrations.

Figure 7:
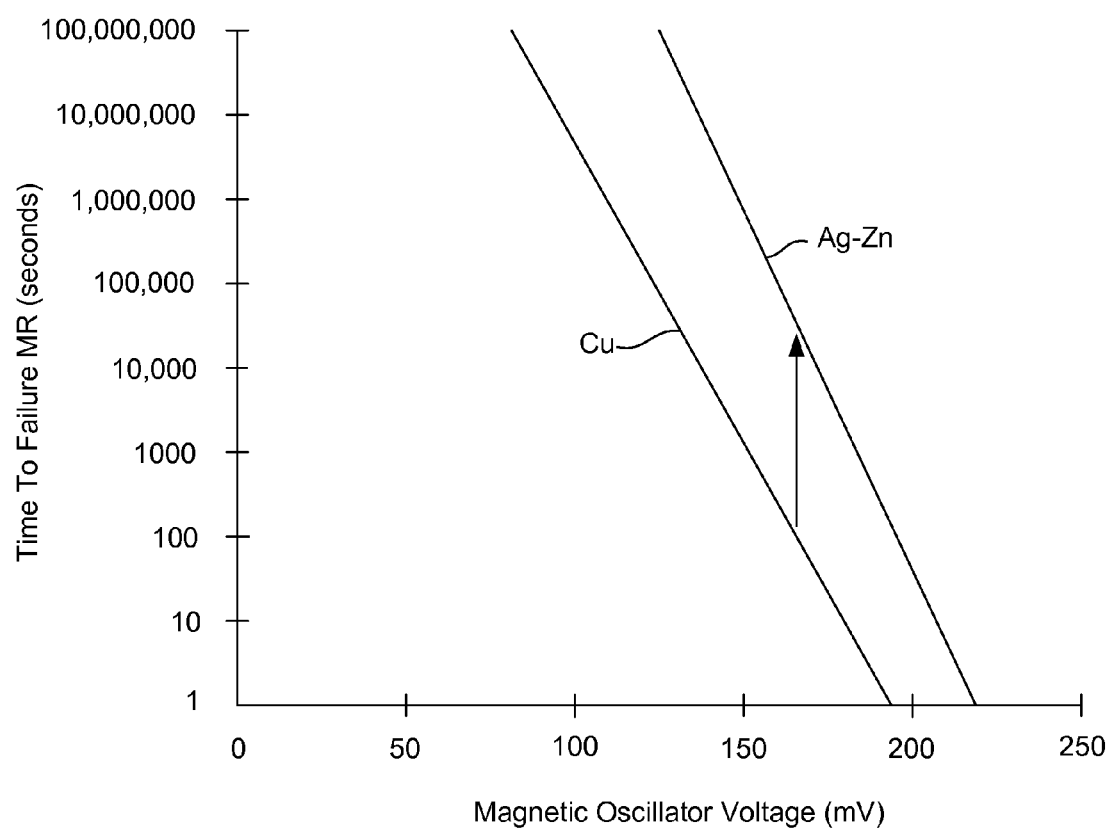
FIG. 7 is a graph showing lifespan of a magnetic oscillator using a Ag—Zn alloy in its intermediate layer as compared with a magnetic oscillator using Cu in its intermediate layer.

FIG. 7 shows the lifespan of a magnetic oscillator having an Ag—Zn intermediate layer as compared with a magnetic oscillator having a Cu oscillator. As can be seen, the lifespan of the magnetic oscillator having the Ag—Zn intermediate layer has a lifespan that is two orders of magnitude greater than that of the magnetic oscillator having the Cu intermediate layer. That is, at a given voltage the difference in lifespan between the magnetic oscillator having the Ag—Zn intermediate layer is about two orders of magnitude greater than that of the magnetic oscillator having the Cu intermediate layer, as indicated by the vertical arrow in FIG. 7. As can be seen, then, the use of an Ag—Zn alloy in an intermediate layer of a magnetic oscillator provides a very large increase in reliability and robustness.

Figure 8:
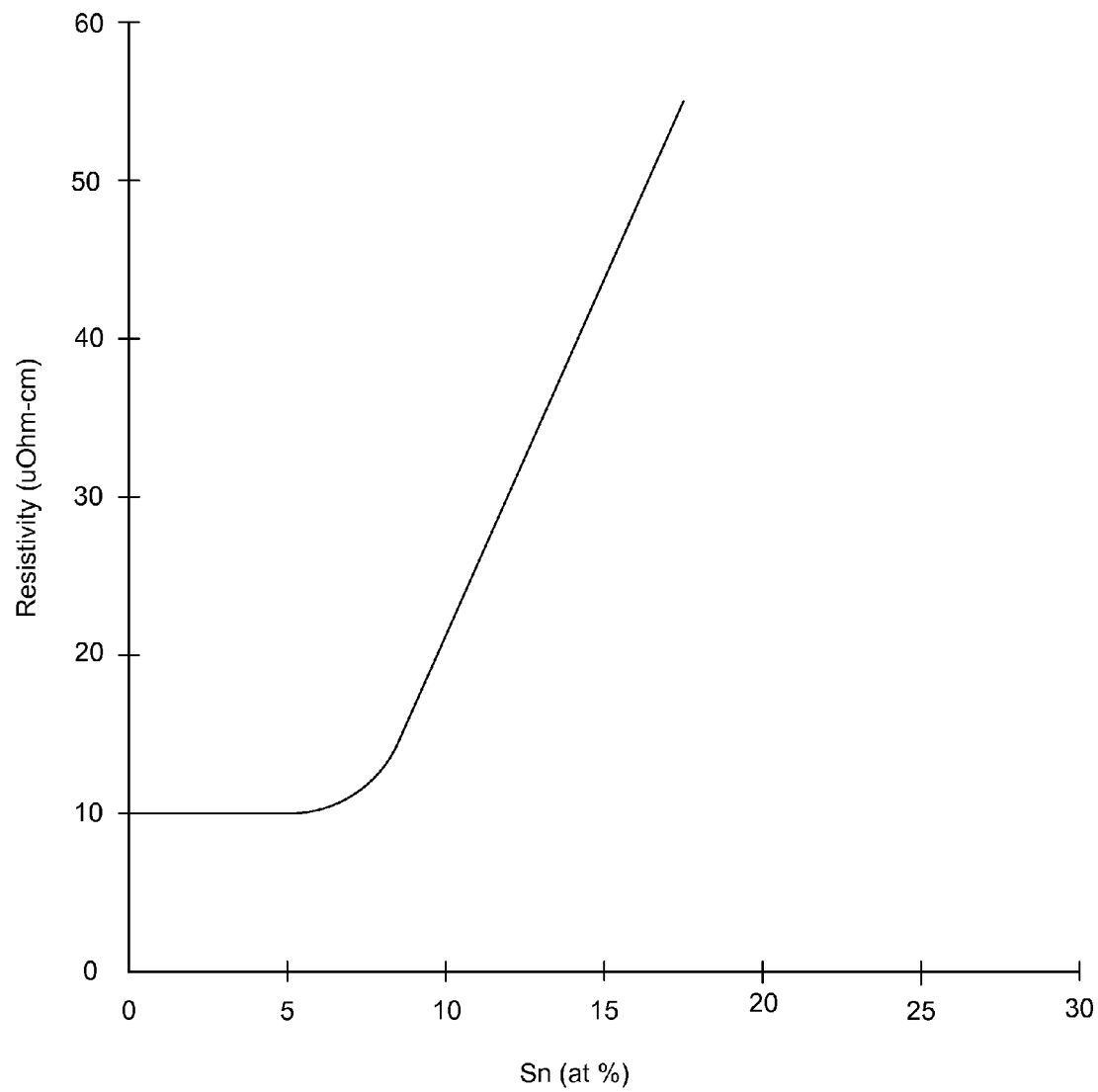
FIG. 8 is a graph showing resistivity as a function of Sn content for a magnetic oscillator having a Ag—Sn intermediate layer.
Figure 9:
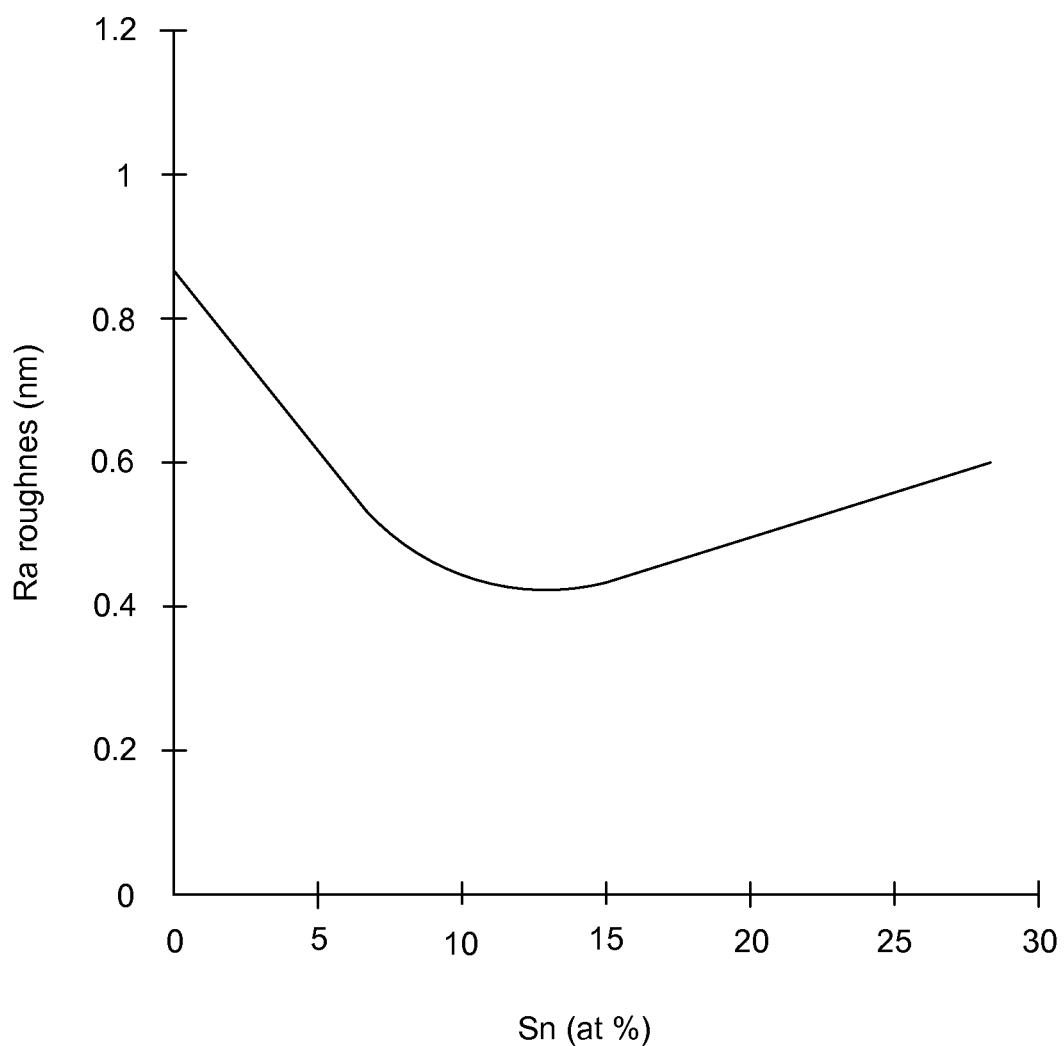
FIG. 9 is a graph showing roughness as a function of Sn content for a magnetic oscillator having a Ag—Sn intermediate layer.

FIGS. 8-11 illustrate the performance and reliability advantages afforded by the use of an Ag—Sn alloy in an intermediate layer of a magnetic oscillator. FIG. 8 shows the resistivity of the intermediate layer in a magnetic oscillator for various Sn concentrations. As can be seen, the resistivity remains low at around 10 uOhms at Sn concentration of up to about 7 atomic percent, and remains below the desired level of 30 uOhm at Sn concentrations up to about 13 atomic percent. In addition, as shown in FIG. 9, the roughness of the intermediate layer remains desirable, for example below 0.6 nm, for Sn ranges of about 3-27 atomic percent Sn.

Figure 10:
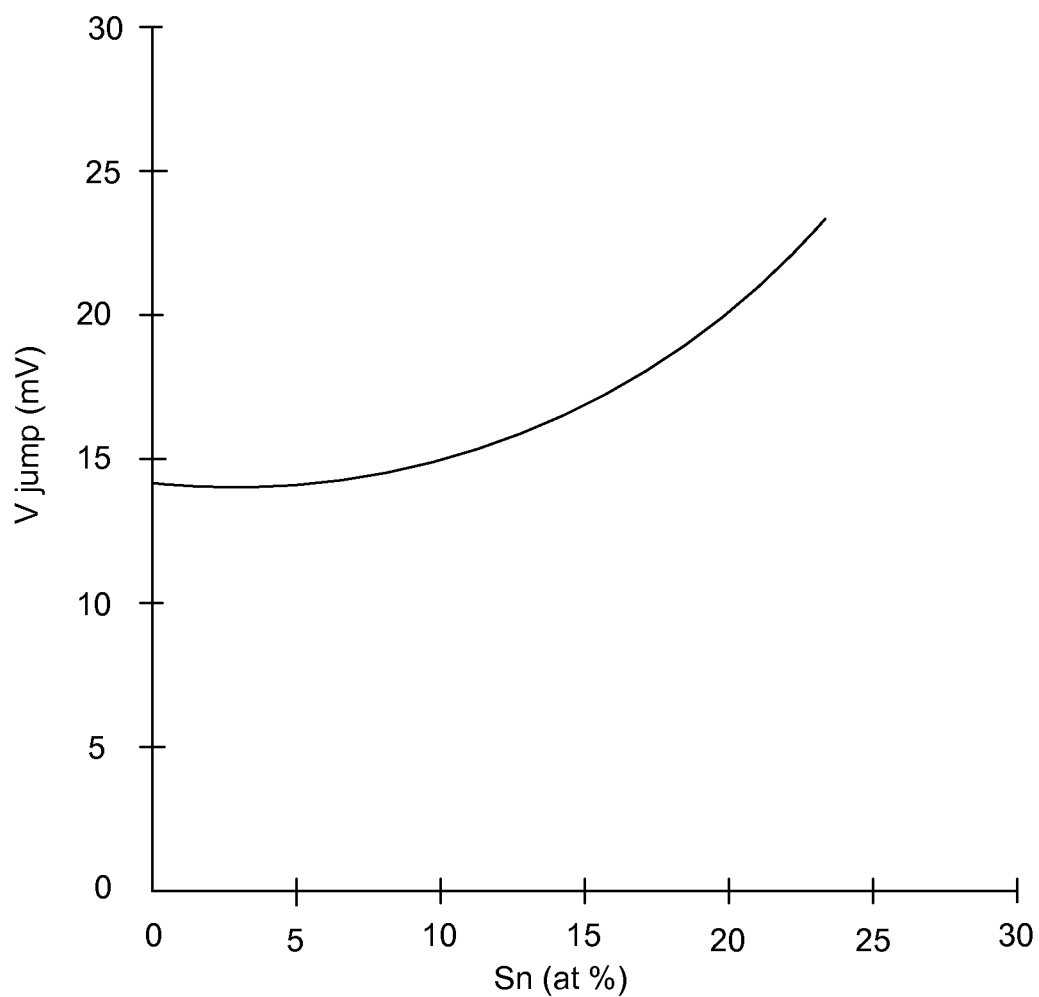
FIG. 10 is a graph showing voltage jump (V jump) as a function of Sn content for a magnetic oscillator having a Ag—Sn intermediate layer.
Figure 11:
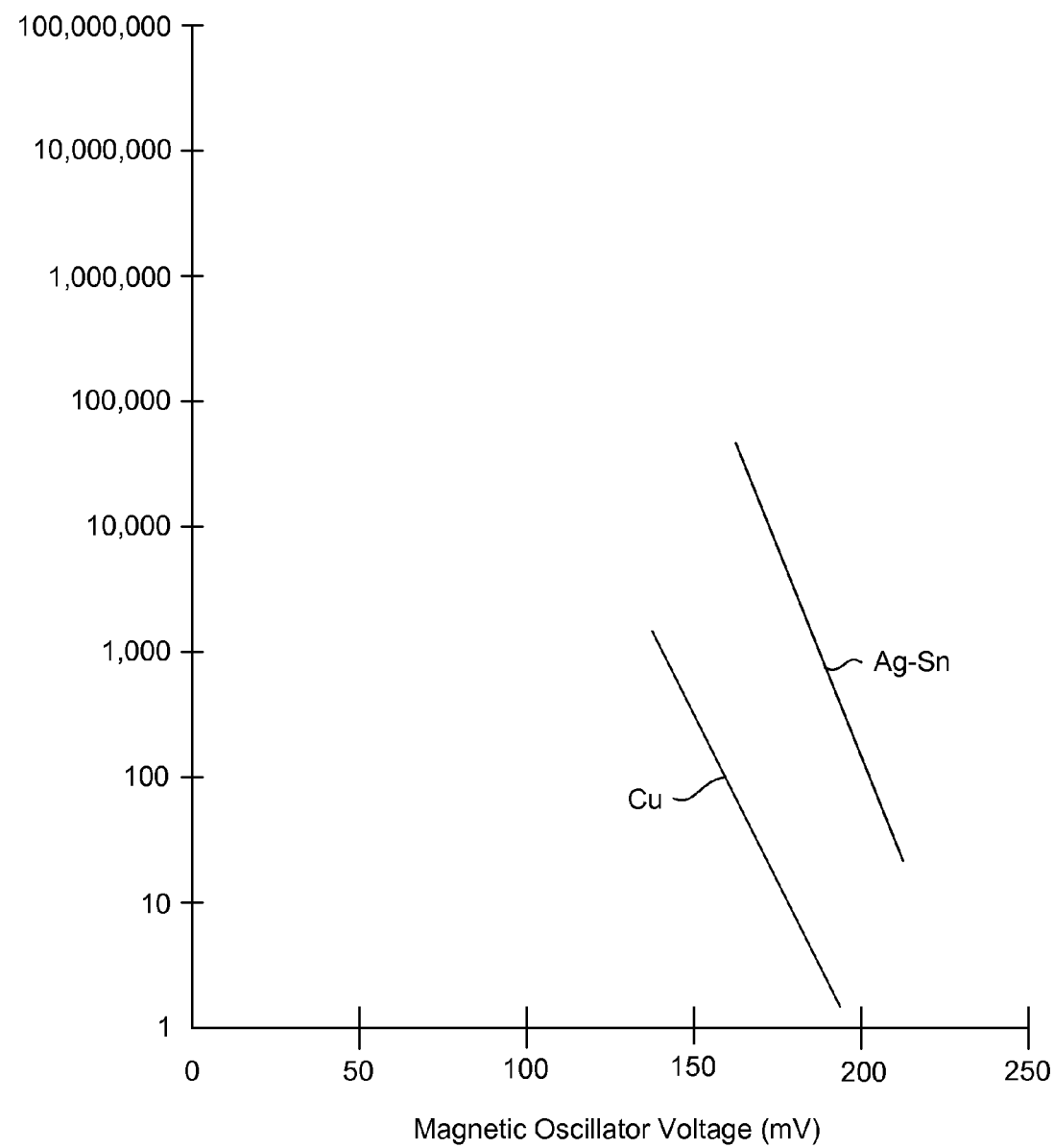
FIG. 11, is a graph showing a the difference in life span of a magnetic oscillator having an intermediate layer formed of a Ag—Sn alloy as compared with a magnetic oscillator having an intermediate layer formed of Cu.

Also, as shown in FIG. 10, the voltage jump (V jump) remains below a target value of 17 mV for Sn ranges of 3-13 atomic percent. FIG. 11 shows the lifespan (time to failure) of a magnetic oscillator having an Ag—Sn intermediate layer as compared with that of a magnetic oscillator having a Cu intermediate layer. Again, the use of the Ag—Sn increases the lifespan of the magnetic oscillator by two orders of magnitude. Therefore, from the above it can be seen that the use of an Ag—Sn intermediate layer having 3-13 atomic percent provides exceptional performance and reliability advantages in a magnetic oscillator for microwave assisted magnetic recording (MAMR).

While various embodiments have been described above, it should be understood that they have been presented by way of example only and not limitation. Other embodiments falling within the scope of the invention may also become apparent to those skilled in the art. Thus, the breadth and scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic oscillator, comprising:
   a magnetic spin polarization layer;
   a magnetic field generation layer; and
   a nonmagnetic intermediate layer between the magnetic spin polarization layer and the magnetic field generation layer, the nonmagnetic intermediate layer comprising an Alloy of Ag and Zn.

2. The magnetic oscillator as in claim 1, wherein the intermediate layer comprises Ag—Zn having 5-50 atomic percent Zn.

3. The magnetic oscillator as in claim 1, wherein the magnetic oscillator is formed on and electrically connected with a magnetic write pole.

4. A magnetic write element, comprising:
a magnetic write pole;
a trailing magnetic shield; and
a magnetic oscillator located between and contacting the magnetic write pole and the magnetic trailing shield, the magnetic oscillator further comprising:
a magnetic spin polarization layer;
a magnetic field generation layer; and
a nonmagnetic intermediate layer between the magnetic spin polarization layer and the magnetic field generation layer, the nonmagnetic intermediate layer comprising an Alloy of Ag and an element X, where X is selected from the group consisting of Zn and Sn.

5. The magnetic write element as in claim 4, wherein the intermediate layer comprises Ag—Zn having 5-50 atomic percent Zn.

6. The magnetic write element as in claim 4, wherein the intermediate layer comprises Ag—Sn having 3-13 atomic percent Sn.

7. The magnetic write element as in claim 4, further comprising a magnetic return pole that is magnetically connected with the magnetic write pole in a region removed from a media facing surface.

8. The magnetic write element as in claim 4 further comprising circuitry connected with the magnetic write pole and the magnetic trailing shield for supplying an electrical current through the magnetic oscillator.

9. The magnetic write element as in claim 4 wherein the magnetic oscillator is a spin torque oscillator.

10. A magnetic data recording system, comprising:
a housing;
a magnetic media held within the housing;
an actuator held within the housing;
a slider connected with the actuator for movement adjacent to a surface of the magnetic media; and
a write element formed on the slider, the write element further comprising:
a magnetic write pole;
a trailing magnetic shield; and
a magnetic oscillator located between and contacting the magnetic write pole and the magnetic trailing shield, the magnetic oscillator further comprising:
a magnetic spin polarization layer;
a magnetic field generation layer; and
a nonmagnetic intermediate layer between the magnetic spin polarization layer and the magnetic field generation layer, the nonmagnetic intermediate layer comprising an Alloy of Ag and an element X where X is selected from the group consisting of Zn and Sn.

11. The magnetic data recording system as in claim 10, wherein the intermediate layer comprises Ag—Zn having 5-50 atomic percent Zn.

12. The magnetic data recording system as in claim 10, wherein the intermediate layer comprises Ag—Sn having 3-13 atomic percent Sn.

13. The magnetic data recording system as in claim 10, wherein the write element further comprises circuitry connected with the magnetic write pole and the magnetic trailing shield for supplying an electrical current through the magnetic oscillator.

* * * * *